United States Patent
Sebastian et al.

(10) Patent No.: US 8,101,446 B2
(45) Date of Patent: Jan. 24, 2012

(54) DIODE LASER BARS AND METHOD FOR THE PRODUCTION THEREOF

(75) Inventors: Juergen Sebastian, Berlin (DE); Ralf Huelsewede, Koenigs-Wusterhausen (DE)

(73) Assignee: JENOPTIK Diode Lab GmbH, Berlin (DE)

( * ) Notice: Subject to any disclaimer, the term of this patent is extended or adjusted under 35 U.S.C. 154(b) by 1 day.

(21) Appl. No.: 12/530,222

(22) PCT Filed: Mar. 7, 2008

(86) PCT No.: PCT/EP2008/001849
§ 371 (c)(1),
(2), (4) Date: Sep. 8, 2009

(87) PCT Pub. No.: WO2008/107204
PCT Pub. Date: Sep. 12, 2008

(65) Prior Publication Data
US 2010/0067556 A1  Mar. 18, 2010

(30) Foreign Application Priority Data
Mar. 7, 2007  (DE) .......................... 10 2007 011 564

(51) Int. Cl.
*H01L 21/00* (2006.01)
(52) U.S. Cl. ............... 438/34; 438/29; 438/496; 257/79
(58) Field of Classification Search .................... 438/29, 438/34, 496; 257/79
See application file for complete search history.

(56) References Cited

U.S. PATENT DOCUMENTS

| | | | |
|---|---|---|---|
| 5,394,426 A * | 2/1995 | Joslin | 372/50.12 |
| 5,715,264 A * | 2/1998 | Patel et al. | 372/36 |
| 6,013,540 A * | 1/2000 | Peale | 438/33 |
| 6,175,452 B1 * | 1/2001 | Ullmann et al. | 359/641 |
| 7,269,197 B2 * | 9/2007 | Fratti et al. | 372/50.12 |
| 2002/0076943 A1 | 6/2002 | Ohta et al. | |
| 2003/0091079 A1 * | 5/2003 | Yokota | 372/44 |
| 2004/0047380 A1 | 3/2004 | Moriya et al. | |
| 2004/0228382 A1 | 11/2004 | Oshima | |
| 2005/0064090 A1 | 3/2005 | Yeh et al. | |
| 2005/0221549 A1 | 10/2005 | Horie | |
| 2006/0216842 A1 | 9/2006 | Charache et al. | |
| 2007/0228105 A1 * | 10/2007 | Oshika et al. | 228/101 |

OTHER PUBLICATIONS

International Search Report for International application No. PCT/EP2008/001849, dated Jul. 3, 2008, 6 pages.
English translation of Written Opinion for International application No. PCT/EP2008/001849, dated Jul. 3, 2008, 6 pages.

\* cited by examiner

*Primary Examiner* — Jarrett Stark
*Assistant Examiner* — Nicholas Tobergte
(74) *Attorney, Agent, or Firm* — Skaar Ulbrich Macari, P.A.

(57) ABSTRACT

There is provided a method for the production of diode laser bars from a wafer, wherein a metal layer is applied to the wafer in such a way that it does not extend up to the later facets of the diode laser bars to be separated, the diode laser bars are separated and stacked one atop another, the metal layer producing a gap between the facets of the stacked diode laser bars and the metal layer being selected in such a way that clogging of the gap during coating of a facet is prevented.

11 Claims, 4 Drawing Sheets

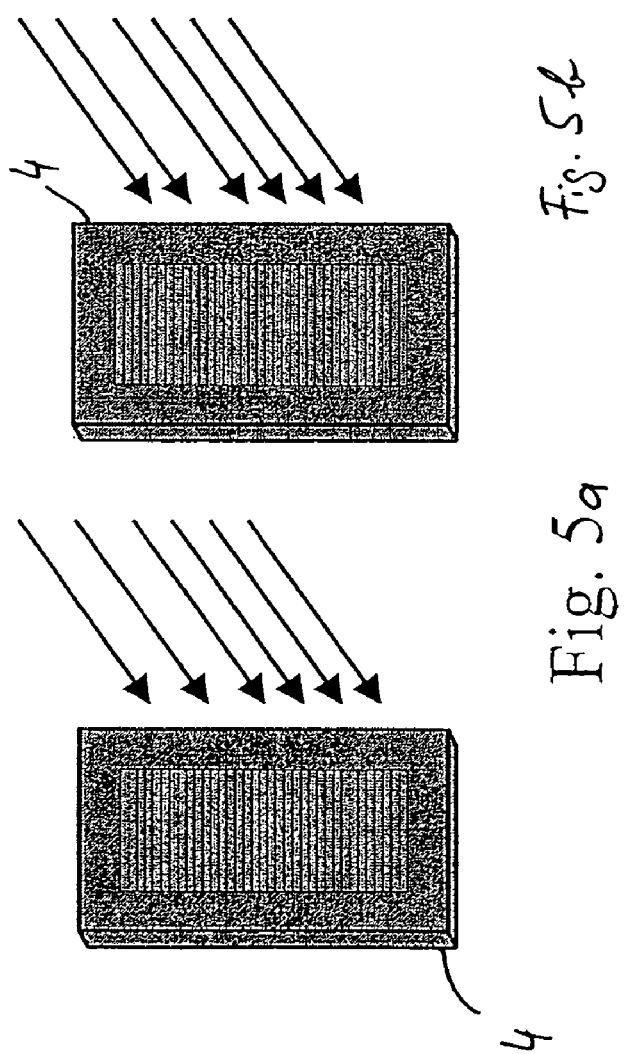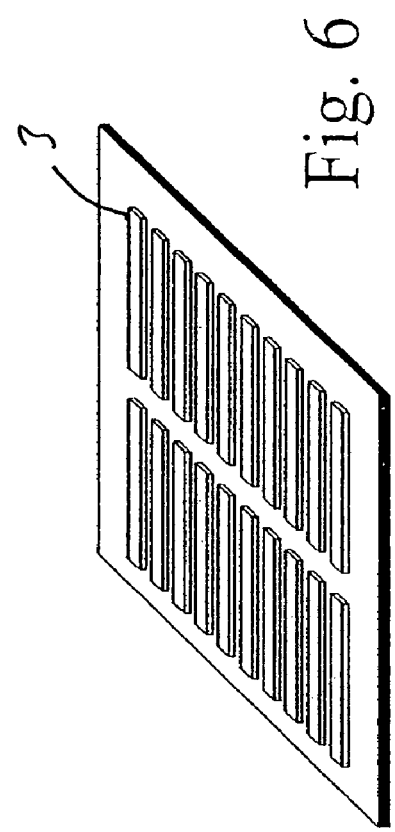

DIODE LASER BARS AND METHOD FOR THE PRODUCTION THEREOF

FIELD

The invention relates to a method for the production of diode laser bars and to diode laser bars.

BACKGROUND

Diode laser bars (or edge-emitting diode lasers) are produced on the basis of 1" to 4" (1 to 4 inches=2.45 cm to 10.16 cm) wafers or fragments thereof. FIG. 1 shows a wafer 1 which has already been processed and from which the diode laser bars are produced.

The light from the diode lasers is emitted in the wafer plane. Therefore, the wafers 1 are broken down by a cleaving process. Thus, the wafer 1 can first be broken down into fields 2 (FIG. 2) which are then each broken down into blocks 3 (FIG. 3). It is known that the wafer 1 can also be broken down immediately into the blocks 3 without taking the detour via the fields 2.

The blocks 3 thus produced (which are also named bars) contain the individual diode lasers or the individual emitters. The cleavage surfaces are the emitting surfaces (what are known as light-issuing windows or facets). In order to protect these emitting surfaces and for targeted alteration of the reflective capacity of the two cleavage surfaces, these surfaces have to be coated with, for example, dielectric layers.

For the necessary coating process, the individual blocks 3 (bars) are stacked one above another. In FIG. 4 the stacked bars 3 are shown schematically in a holding device 4. The front (FIG. 5a) and the back (FIG. 5b) of the bars 3 stacked in the holding device 4 are then coated. The cleavage surfaces to be coated of the blocks 3 form, after stacking over all the stacked blocks 3, an almost closed surface. The distance between two blocks lying one above the other is so small that a film which is closed over all the stacked blocks is produced during a coating process. The direct stacking of the blocks one atop another leads to contact between metal layers located on the upper side and underside of the blocks. The oscillations in the coating installations then cause the blocks to stick to one another (high adhesion as a result of micro-cold welding). These two processes, the formation of a closed coating film over all the blocks of a stack and the sticking of the blocks to one another, lead to the following drawbacks:

The sticking of the blocks to one another greatly impedes or prevents unstacking after the coating. FIG. 6 shows the unstacked blocks 3 schematically. The blocks can no longer be separated or can be separated only by appropriate mechanical aids and levers. Both lead to marked contaminations of the blocks and their coated facets and thus to marked losses.

At the same time, the closed layer of the coating leads to grave difficulties during the separation of the individual blocks stacked one above another. It is possible to separate the blocks only by tearing the film. This tearing is an uncontrolled process which can greatly reduce the ability of the coating to adhere to the cleavage surfaces and/or leads to damage to the coating of the facet. Both lead to a reduction in yield and curtail the service life of the diode lasers.

Furthermore, an offset and/or twisting can occur between the blocks during stacking of the blocks 3. This offset and/or twisting leads to shading of parts of the blocks during the coating. Blocks 3 affected thereby must be discarded as defective products.

The formation of a closed film on the facets and the sticking of the blocks on one another are currently prevented as a result of the fact that a shorter dummy block or simply spacer pieces are placed between two blocks. This produces a gap between the blocks and it is not possible for a closed surface to be formed from the coating material. This eliminates the difficulty of the tearing of the coating surface.

The blocks are also prevented from sticking to one another as a result of the fact that a different, generally very smooth, material is positioned between the metal layers of the blocks.

The drawback of this method is:

a) A reduction in the capacity of the coating process by 50% (half of the coated blocks are dummy blocks). At on average 40 hours for a complete coating process (stacking of the blocks, coating of the fracture surfaces and unstacking of the blocks), that is a major cost factor in production.

b) In order to coat the same number of blocks, twice the time is required for stacking and unstacking the blocks.

c) The dummy blocks produce additional costs (material, procurement, machining, disposal).

d) The dummy blocks are generally used a plurality of times in order to minimise costs. As the number of uses of the dummy blocks increases, there is the risk of chipping of coating material from the dummy blocks. This chipping or these particles lead to contamination of the actual diode laser blocks and thus to failures.

e) The use of dummy blocks represents an additional source of error in the overall process for the machining.

The dummy blocks can prevent the difficulty of shading only on one of the cleavage surfaces to be coated, but not on both cleavage surfaces. Thus, the difficulty of shading remains unsolved.

US 2005/0221549 A1 discloses a method for the production of diode laser bars in which an anti-adhesive material or platinum is applied to corners or edges of the individual chips in order to prevent thermocompressive bonding of the stacked bars based on the direct contact of extensive gold surfaces on one another.

However, the anti-adhesive material or platinum applied to the corners or edges leads to the drawback that, again, a continuous coating layer is present on the facets which can disadvantageously influence the unstacking of the diode laser bars and also lead to tearing of the coating.

It is known from US 2005/0064090 A1 to prevent shading of the facets during the coating by arranging additional dummy blocks between the individual diode laser bars. Furthermore, it is known to etch trenches into the back of the diode laser bars. However, such etching of trenches leads to a reduction in yield if the wafer, which is just 0.1 mm thick, is further machined photolithographically and wet-chemically using the method described in US 2005/0064090 A1, so that overall no improvement of the total production process is obtained.

SUMMARY

Starting therefrom, it is the object of the invention to provide a method for the production of diode laser bars with which the yield of the diode lasers can be increased and the diode lasers produced have higher quality (for example improved service life).

The object is achieved by a method for the production of diode laser bars from a wafer or wafer fragments, wherein a metal layer is applied to the wafer or the wafer fragments in such a way that it does not reach up to the later facets of the diode laser bars to be separated or does not extend up to the later facets and is thus set apart from the later facets (or cleavage edges), the diode laser bars are separated and stacked one atop another, the metal layer producing a gap between the facets of the stacked diode laser bars and the metal layer being selected in such a way that clogging of the gap during subsequent coating of a facet is prevented.

During the subsequent coating of the facet, a dielectric coating for example, can be applied. The reflective capacity of the facets can, for example, be purposefully adjusted using a dielectric coating of this type.

The metal layer produces, in the stacked diode laser bars, a respective gap preventing the formation of a closed layer during the coating of the facets. For this purpose, the gap height is defined over the thickness of the metal layer and the gap depth is defined over the distance of the metal layer from the facet. Furthermore, it has surprisingly been found that an offset or twisting of the diode laser bars during stacking does not lead to shading during the coating process.

In the method two trenches can be formed in the metal layer using suitable methods at the distance of the later resonator length perpendicular to the resonator. It is thus possible to ensure that the later facets are not covered by the metal layer or that the metal layer does not reach up to the later facets.

The metal layer has, in particular, a minimum thickness which prevents clogging of the gap during the coating of a facet. In particular, the thickness of the metal layer may be greater than 500 nm.

Furthermore, the metal layer may have a thickness from the range of from 0.5-3 µm, in particular from the range of from 0.5-5 µm. The wafer thickness of the diode laser bar may be approx. 120 µm.

The metal layer may be formed as a closed strip over all the diode lasers (emitters) of a bar. It is however also possible for the metal layer to be separated or interrupted between the individual lasers of a bar.

The metal layer can be applied to the upper side (p-side) and/or to the underside (n-side) of the wafer.

The metal layer can be applied by a chemical method (for example an electrolytic method), a physical method (for example sputtering) and/or a thermal method (for example electron beam evaporation).

The metal layer may consist, in particular, of gold. The metal layer, which is formed as a gold layer, can be configured in such a way that it serves as a gold reservoir for the formation of metallic phases for a permanent soldered connection between the diode laser and a suitable underlay (such as for example a submount or a heat sink).

Furthermore, the metal or gold layer can be sheathed with a solder barrier.

In addition, at least one trench, which reaches up to the later facet of the diode laser bars to be separated, can be produced directly in the wafer on the upper side and/or underside. In this case, the thickness of the metal layer can be reduced, as the gap height is determined by the trench depth plus the thickness of the metal layer.

The trench can, if it is formed on the same side of the wafer as the metal layer, extend up to the metal layer. In this case, the gap depth corresponds to the trench width from the metal layer up to the facet.

A diode laser bar with two facets and a metal layer applied to the upper side and/or underside is further provided, the metal layer not extending up to the facets and its thickness being selected in such a way that there is provided, in the case of coating a facet of a plurality of stacked diode laser bars of this type, a gap between the facets that does not become clogged during the coating of a facet. This can effectively prevent formation of a closed film over all the facets of the stacked diode laser bars, as a result of which the yield and quality of the diode laser bars coated in this way is increased.

In the case of the diode laser bar, the metal layer can have two trenches at the distance of the later resonator length perpendicular to the resonator, so that the metal layer does not extend up to the facets.

The diode laser bar can furthermore comprise the features which a diode laser bar produced by the foregoing method comprises.

It will be understood that the features mentioned hereinbefore and those to be commented on hereinafter may be used not only in the specified combinations, but also in other combinations or in isolation, without departing from the scope of the present invention.

BRIEF DESCRIPTION OF THE DRAWINGS

The invention will be commented on in greater detail hereinafter by way of example with reference to the appended drawings which also disclose features essential to the invention and in which:

FIG. 5a shows the coating of the front of the stacked blocks;

FIG. 5b shows the coating of the back of the stacked blocks;

FIG. 6 is an illustration of the unstacked coated blocks;

DETAILED DESCRIPTION

Figure 1:
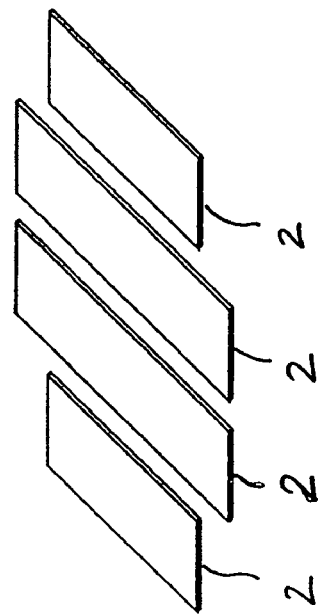
FIG. 1 shows a processed wafer for the production of diode laser bars.
Figure 2:
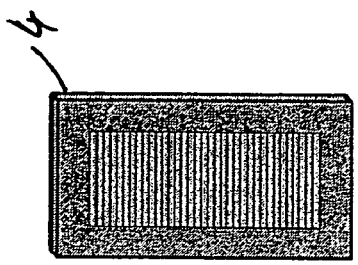
FIG. 2 shows the separated fields of the wafer from FIG. 2.
Figure 3:
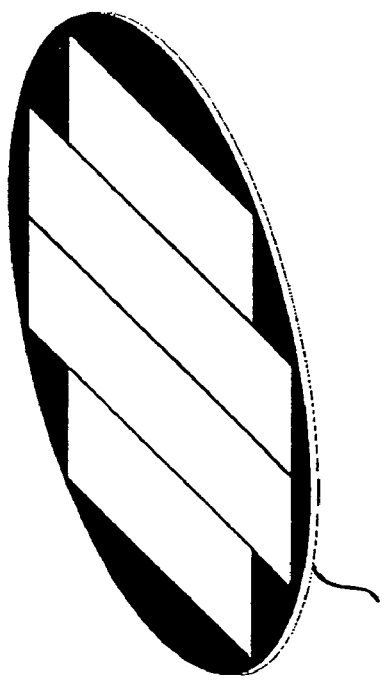
FIG. 3 shows the separated bars of the fields from FIG. 2.
Figure 4:
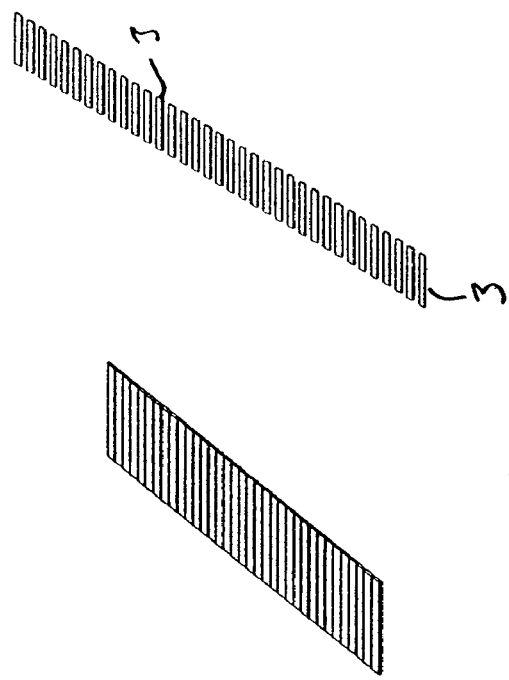
FIG. 4 shows the stacked blocks from FIG. 3.

In the method according to the invention for the production of diode laser bars, the processed wafer 1 from FIG. 1 is processed somewhat differently from the manner in which it was processed in the past. As may be seen in the detail of the block 3, which has already been separated, in FIG. 7, a thicker metal layer B is applied to the surface A of the diode laser bar 3. The thickness of the metal layer may be greater than 500 nm.

Two trenches C and D are formed using suitable methods in this metal layer B at a distance of the later resonator length perpendicular to the resonator. The trenches C and D set the distance of the metal layer B from the cleavage surface E or facet, wherein in the exemplary embodiment described here the cleavage surface E was produced precisely centrally in the trenches C and D, so that the distance corresponds to precisely half the width of the trenches C and D.

Figure 7:
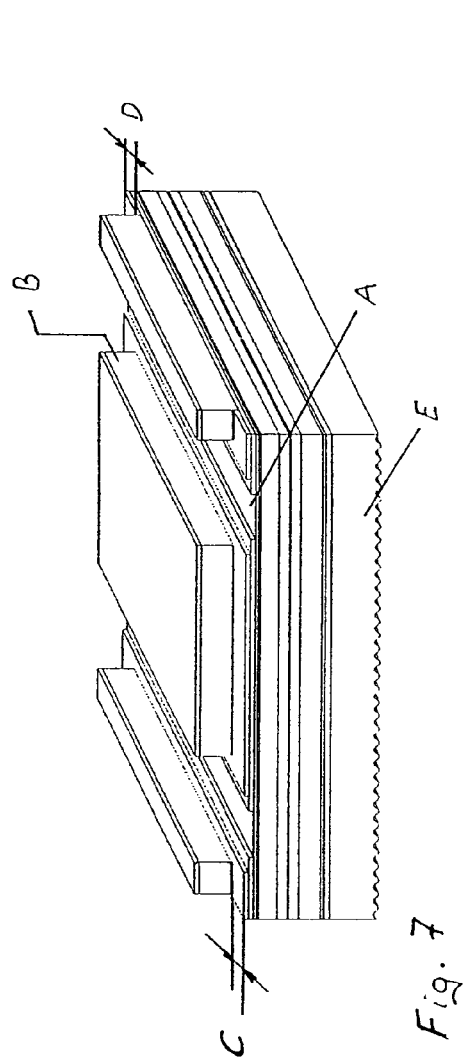
FIG. 7 shows a detail of a diode laser bar according to the invention.

The metal layer B can both be designed as a closed strip (not shown) over all the diode lasers (emitters) of a block (bar) and be separated or interrupted between the individual lasers, as is shown in FIG. 7.

The thicker metal layer B may be located both on the upper side (p-side, as is illustrated in FIG. 7) and on the underside (referred to as the n-side or else substrate side; not shown).

The trench can also be produced directly in the semiconductor (both on the upper side and on the underside). This allows the thickness of the metal layer B to be reduced.

As described hereinbefore, the blocks are cleaved in or along the trenches C, D and separated from one another into the blocks. The widths of the remaining trenches form, after the cleaving, the distance from the metal layer B to the cleavage surface E.

Figure 8:
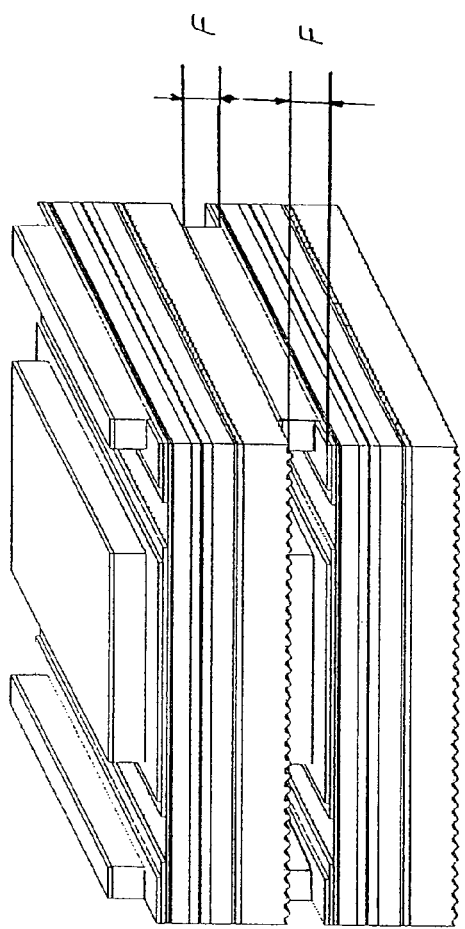
FIG. 8 shows details of two stacked diode laser bars.

This distance from the cleavage surface E (facet) forms, together with the height of the metal layer B, when stacking during the coating process a gap F (FIG. 8) which separates two blocks 3, resting one on the other, at the facet E and thus prevents the formation of a coating field which is closed over all the blocks.

The metal layer B may consist preferably of gold which can be applied by chemical (for example electrolytically), physical (for example sputtering) or thermal (for example electron beam evaporation) methods.

The gold layer can serve, in specific assembly methods, as a gold reservoir for the formation of specific metallic phases for a permanent soldered connection between the diode laser and a suitable underlay (for example a submount or heat sink).

If the formation of specific metallic phases is to be prevented, the gold layer B can be sheathed with a solder barrier during the production process. This sheathing prevents the thick gold layer from connecting to the solder.

Figure 9:
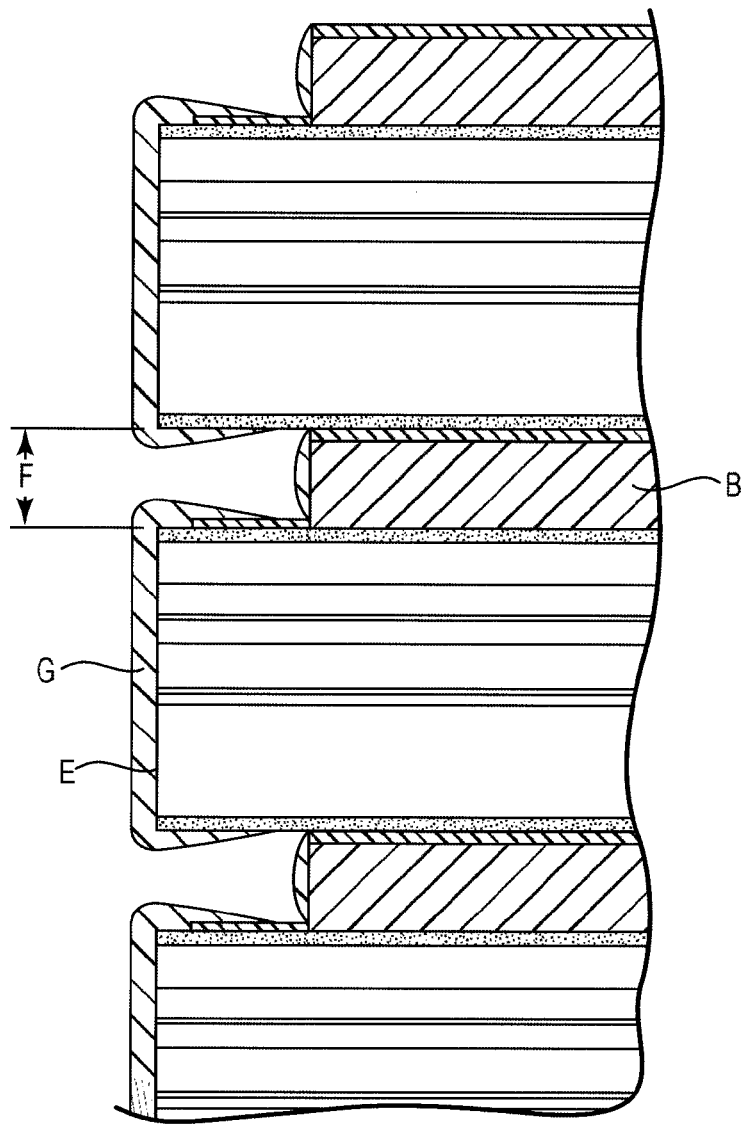
FIG. 9 shows a side view cross-section detail of stacked diode laser bars.

The stacked bars 3 are coated in the same manner as is shown in FIGS. 5a and 5b in order to define the facet property. As the gap F, shown in FIG. 9, is present between adjacent bars, no film which is closed over all the facets is formed during the coating, so that the subsequent unstacking can easily be carried out without damaging the bars 3 or the facet coating G.

Afterwards, steps which are known to the person skilled in the art for finishing the diode laser bars can be carried out.

While the invention has been described in connection with what is presently considered to be the most practical and preferred embodiments, it will be apparent to those of ordinary skill in the art that the invention is not to be limited to the disclosed embodiments. It will be readily apparent to those of ordinary skill in the art that many modifications and equivalent arrangements can be made thereof without departing from the spirit and scope of the present disclosure, such scope to be accorded the broadest interpretation of the appended claims so as to encompass all equivalent structures and products.

The invention claimed is:

1. A method for the production of diode laser bars from a wafer, the diode laser bars each including a facet, the method comprising:

applying a metal layer with a thickness greater than 500 nm to the wafer that does not extend up to the facets of a plurality of diode laser bars to be separated;

separating and stacking the plurality of diode laser bars atop one another;

providing a metal layer to define a gap between the respective facets of the stacked diode laser bars; and coating the facets, wherein the metal layer is selected to prevent clogging of the gap during the coating of the facets.

2. The method of claim 1, further comprising forming two trenches in the metal layer at a distance of resonator length in a direction perpendicular to a resonator, wherein the metal layer does not extend up to the later facets of the diode laser bars to be separated.

3. The method of claim 1, wherein the step of providing a metal layer comprises providing a metal layer configured as a closed strip over all the diode lasers of a bar.

4. The method of claim 1, wherein the step of providing a metal layer comprises separately configuring the metal layer separately between the individual layers of the bar.

5. The method of claim 1, wherein the step of providing a metal layer comprises applying the metal layer to at least one of the upper side and the underside of the wafer.

6. The method of claim 1, wherein the metal layer is applied in at least one of a chemical, physical and thermal process.

7. The method of claim 1, wherein the metal layer consists of gold.

8. The method of claim 7, wherein the step of providing a metal layer comprises configuring the gold metal layer to serve as a gold reservoir for the formation of metallic phases for a permanent soldered connection between the diode laser and a suitable underlay.

9. The method of claim 1, further comprising sheathing the metal layer with a solder barrier.

10. The method of claim 1, further comprising wherein at least one trench, which reaches up to the later facet of the diode laser bars to be separated, is produced directly in the wafer on at least one of the upper side and underside.

11. A plurality of stacked diode laser bars comprising:
at least two facets;
a dielectric coating applied to the facets; and
a metal layer with a thickness greater than 500 nm applied to at least one of the upper side and underside of each of the plurality of stacked diode laser bars, which does not extend up to the facets thereof and the thickness of which defines a gap between the facets configured to prevent clogging by the dielectric coating applied to the facets.

* * * * *